(12) United States Patent
Qu

(10) Patent No.: US 11,617,284 B2
(45) Date of Patent: *Mar. 28, 2023

(54) ASSEMBLIES INCLUDING HEAT DISPERSING ELEMENTS AND RELATED SYSTEMS AND METHODS

(71) Applicant: Micron Technology, Inc., Boise, ID (US)

(72) Inventor: Xiaopeng Qu, Redmond, WA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/201,085

(22) Filed: Mar. 15, 2021

(65) Prior Publication Data

US 2021/0204446 A1 Jul. 1, 2021

Related U.S. Application Data

(63) Continuation of application No. 15/795,690, filed on Oct. 27, 2017, now Pat. No. 10,952,352.

(51) Int. Cl.
*H05K 7/20* (2006.01)
*H05K 7/14* (2006.01)
*H05K 1/18* (2006.01)
*F28F 3/02* (2006.01)
*H05K 1/02* (2006.01)
(Continued)

(52) U.S. Cl.
CPC .......... *H05K 7/20509* (2013.01); *F28F 3/02* (2013.01); *G06F 1/20* (2013.01); *H05K 1/0203* (2013.01); *H05K 1/181* (2013.01); *H05K 7/1427* (2013.01); *H05K 7/20127* (2013.01); *H05K 7/20136* (2013.01); *H05K 7/20436* (2013.01); *H05K 3/366* (2013.01); *H05K 2201/10159* (2013.01);
(Continued)

(58) Field of Classification Search
CPC ............... H05K 1/0203; H05K 1/0204; H05K 2201/066; H05K 3/368; H05K 7/205094; H05K 7/20509; H05K 1/0201
See application file for complete search history.

(56) References Cited

U.S. PATENT DOCUMENTS 3,268,772 A 8/1966 Hiroshi et al.
3,284,672 A * 11/1966 Munn .................... H01R 12/00
361/730

(Continued)

FOREIGN PATENT DOCUMENTS

JP 2002-280499 A 9/2002
JP 2014-165378 A 9/2014

OTHER PUBLICATIONS

Chinese First Office Action for Chinese Application No. 201811234538. 3, dated Jul. 20, 2022, 23 pages with translation.

*Primary Examiner* — Krystal Robinson
(74) *Attorney, Agent, or Firm* — TraskBritt

(57) ABSTRACT

Assemblies include at least one substrate, at least one electronic device coupled to the substrate, and heat dissipation elements. The heat dissipation elements comprise at least one heat spreader in communication with the at least one electronic device and at least one heat sink in communication with the at least one heat spreader. Methods of dissipating heat energy include transferring heat energy from memory devices to heat spreaders positioned adjacent to the memory devices and transferring the heat energy from the heat spreaders to a heat sink.

19 Claims, 6 Drawing Sheets

(51) Int. Cl.
   *G06F 1/20*   (2006.01)
   *H05K 3/36*   (2006.01)
(52) U.S. Cl.
   CPC ............. *H05K 2201/10189* (2013.01); *H05K 2201/10325* (2013.01); *H05K 2201/10522* (2013.01)

(56) References Cited

U.S. PATENT DOCUMENTS

| | | | |
|---|---|---|---|
| 3,416,597 | A | 12/1968 | Kupferberg |
| 3,631,325 | A * | 12/1971 | Wenz ................. H05K 7/20545 361/705 |
| 4,027,206 | A | 5/1977 | Lee |
| 4,337,499 | A | 6/1982 | Cronin et al. |
| 4,489,363 | A | 12/1984 | Goldberg |
| 5,003,429 | A | 3/1991 | Baker et al. |
| 5,032,952 | A * | 7/1991 | Cooke ................... G06F 1/189 361/747 |
| 5,043,847 | A * | 8/1991 | Deinhardt ............ H05K 7/1469 361/736 |
| 5,077,638 | A | 12/1991 | Andersson et al. |
| 5,184,281 | A | 2/1993 | Samarov et al. |
| 5,294,831 | A | 3/1994 | Azar et al. |
| 5,339,219 | A | 8/1994 | Urich |
| 5,426,567 | A * | 6/1995 | Opeka ................. H05K 7/1461 361/736 |
| 5,432,678 | A | 7/1995 | Russell et al. |
| 5,589,711 | A | 12/1996 | Sano et al. |
| 5,594,623 | A | 1/1997 | Schwegler |
| 5,684,675 | A | 11/1997 | Taniguchi et al. |
| 5,811,879 | A | 9/1998 | Akram |
| 5,892,660 | A | 4/1999 | Farnworth et al. |
| 5,936,305 | A | 8/1999 | Akram |
| 5,966,289 | A * | 10/1999 | Hastings ................ G06F 1/184 165/185 |
| 5,978,873 | A | 11/1999 | Phan |
| 5,982,618 | A | 11/1999 | Roos |
| 6,091,143 | A | 7/2000 | Akram |
| 6,104,089 | A | 8/2000 | Akram |
| 6,153,929 | A | 11/2000 | Moden et al. |
| 6,201,695 | B1 | 3/2001 | Duesman et al. |
| 6,225,689 | B1 | 5/2001 | Moden et al. |
| 6,233,154 | B1 | 5/2001 | Farnworth et al. |
| 6,258,623 | B1 | 7/2001 | Moden et al. |
| 6,288,902 | B1 | 9/2001 | Kim et al. |
| 6,297,960 | B1 | 10/2001 | Moden et al. |
| 6,300,163 | B1 | 10/2001 | Akram |
| 6,319,756 | B2 | 11/2001 | Duesman et al. |
| 6,362,519 | B2 | 3/2002 | Moden et al. |
| 6,449,161 | B2 | 9/2002 | Duesman et al. |
| 6,475,831 | B2 | 11/2002 | Moden et al. |
| 6,486,546 | B2 | 11/2002 | Moden et al. |
| 6,496,373 | B1 | 12/2002 | Chung |
| 6,570,771 | B2 | 5/2003 | Farnworth et al. |
| 6,622,370 | B1 * | 9/2003 | Sherman ................. H01P 3/087 29/592.1 |
| 6,657,862 | B2 | 12/2003 | Crocker et al. |
| 6,661,657 | B1 | 12/2003 | Banton et al. |
| 6,686,655 | B2 | 2/2004 | Moden et al. |
| 6,707,141 | B2 | 3/2004 | Akram |
| 6,707,673 | B2 | 3/2004 | Duesman et al. |
| 6,773,955 | B2 | 8/2004 | Moden et al. |
| 6,781,848 | B2 | 8/2004 | Farnworth et al. |
| 6,807,061 | B1 | 10/2004 | Harris |
| 7,023,701 | B2 | 4/2006 | Stocken et al. |
| 7,079,396 | B2 | 7/2006 | Gates et al. |
| 7,327,570 | B2 | 2/2008 | Belady |
| 7,345,882 | B2 | 3/2008 | Lee et al. |
| 7,477,520 | B2 | 1/2009 | Shibamoto et al. |
| 7,683,725 | B2 | 3/2010 | Kim et al. |
| 7,768,785 | B2 | 8/2010 | Nl et al. |
| 8,059,403 | B2 | 11/2011 | Chou et al. |
| 8,059,406 | B1 | 11/2011 | Meyer et al. |
| 8,081,468 | B2 | 12/2011 | Hill et al. |
| 8,767,403 | B2 | 7/2014 | Rau et al. |
| 8,837,151 | B2 | 9/2014 | Hill et al. |
| 8,913,384 | B2 | 12/2014 | David et al. |
| 9,222,735 | B2 | 12/2015 | Hill et al. |
| 9,645,619 | B2 | 5/2017 | Kinstle, III |
| 9,713,287 | B2 | 7/2017 | Wong et al. |
| 9,716,019 | B2 | 7/2017 | Zhou et al. |
| 10,225,955 | B1 | 3/2019 | Hill et al. |
| 2003/0198022 | A1 | 10/2003 | Ye et al. |
| 2004/0130873 | A1 * | 7/2004 | Hsueh ................. H01L 23/4093 257/722 |
| 2005/0276021 | A1 | 12/2005 | Gates et al. |
| 2005/0277310 | A1 | 12/2005 | Dibene et al. |
| 2006/0126309 | A1 | 6/2006 | Bolle et al. |
| 2006/0132699 | A1 | 6/2006 | Cho et al. |
| 2006/0133039 | A1 | 6/2006 | Belady |
| 2006/0244126 | A1 | 11/2006 | Shibamoto et al. |
| 2007/0070607 | A1 | 3/2007 | Goodwin |
| 2008/0285697 | A1 | 11/2008 | Kim et al. |
| 2009/0045882 | A1 | 2/2009 | Kim et al. |
| 2009/0219687 | A1 | 9/2009 | Lin |
| 2009/0257185 | A1 * | 10/2009 | Signer ................. H05K 7/1489 361/679.32 |
| 2009/0290308 | A1 | 11/2009 | Chen et al. |
| 2009/0310295 | A1 | 12/2009 | Chou et al. |
| 2010/0053880 | A1 * | 3/2010 | Jesionowski ........ G11B 15/689 711/111 |
| 2010/0085712 | A1 | 4/2010 | Hrehor et al. |
| 2010/0182751 | A1 * | 7/2010 | Seow ................... H01L 23/367 361/703 |
| 2010/0188817 | A1 | 7/2010 | Chou et al. |
| 2010/0321895 | A1 | 12/2010 | Hill et al. |
| 2011/0304992 | A1 | 12/2011 | Tan |
| 2012/0061135 | A1 | 3/2012 | Hill et al. |
| 2012/0087094 | A1 | 4/2012 | Hill et al. |
| 2012/0113586 | A1 | 5/2012 | Rau et al. |
| 2012/0162919 | A1 | 6/2012 | Lin |
| 2013/0194745 | A1 | 8/2013 | Meijer et al. |
| 2014/0374080 | A1 | 12/2014 | Hill et al. |
| 2016/0043017 | A1 | 2/2016 | Jones et al. |
| 2016/0218085 | A1 | 7/2016 | Groothuis et al. |
| 2017/0083061 | A1 | 3/2017 | Stellman et al. |
| 2017/0117205 | A1 | 4/2017 | Groothuis et al. |

* cited by examiner

ASSEMBLIES INCLUDING HEAT DISPERSING ELEMENTS AND RELATED SYSTEMS AND METHODS

CROSS-REFERENCE TO RELATED APPLICATION

This application is a continuation of U.S. patent application Ser. No. 15/795,690, filed Oct. 27, 2017, now U.S. Pat. No. 10,952,352, issued Mar. 16, 2021, the disclosure of which is hereby incorporated herein in its entirety by this reference.

TECHNICAL FIELD

Embodiments of the present disclosure relate to assemblies including heat dispersing elements and to related methods. More specifically, various embodiments relate to assemblies including multiple heat dispersing elements to provide cooling for one or more heat-generating components on a substrate and to related methods.

BACKGROUND

Maintaining sufficiently low operating temperatures for electronic heat-generating components, such as integrated circuit devices, is desirable to ensure their proper operation and to extend their useful life. A trend in contemporary circuit design is to provide an assembly of multiple heat-generating components on a circuit board. A consequence of providing multiple heat-generating components on a circuit board, which may include integrated circuit devices operating at relatively high speeds, is substantial heat production that may be detrimental to the operation and life of those components. Conventionally, heat dissipating structures are used to transfer heat from the heat-generating components to an area where the heat can be dissipated, such as the atmosphere. In some applications, in addition to heat dissipating structures, or instead of, forced ventilation may also be provided to remove the heat from the devices.

Some conventional approaches to thermal management of packaged electronic devices require associating individual heat dissipating structures with each of the individual components. The use of individual heat dissipating structures can be expensive and the associated installation may be labor intensive or require significant capital investment in complex assembly equipment. Further, as more heat-generating components are provided onto ever-smaller circuit boards, each heat dissipating structure must be accurately aligned with its neighbor to ensure proper function. Finally, as more heat-generating components are packed into a smaller volume, the use of heat dissipating structures may be impractical, if not impossible, due to sizing constraints.

In the case of heat-generating components, such as memory devices, such devices are conventionally provided in computers and other electronic in the form of semiconductor-based integrated circuits. There are many different types of memory devices including, synchronous dynamic random-access memory (SDRAM), dynamic random-access memory (DRAM), and non-volatile memory such as Flash memory (NAND and NOR), EEPROM, FeRAM and MRAM. As the performance and complexity of electronic systems increase, the requirement for additional memory in memory systems also increases. The trend in the semiconductor industry is toward smaller memory devices that may be fabricated as high-density circuits on a single semiconductor chip. Miniaturization of transistor devices and circuits may be achieved by reducing the size of at least some of the features of devices so that the resulting devices occupy a smaller surface area of a wafer.

To reduce costs of fabricating such high-density memory arrays, the parts count must be kept to a minimum. This means being able to achieve a higher density of memory on a single chip. However, as memory devices decrease in size while increasing the number of memory cells in a memory array, the volume available to provide adequate heat dissipation is also decreased.

In conventional memory module designs, heat spreaders may be attached to primary and secondary sides of a module. This approach is inadequate to cool new generations of memory module having higher power but smaller pitch. For example, fifth generation double data rate RAM may reach 15 W per dual in-line memory module (DIMM) while having a reduced, about 7.6 mm pitch between adjacent modules in a multi-module assembly. This configuration is expected impose a significant challenge when multiple DIMMs work together in the server system.

DETAILED DESCRIPTION

Figure 1:
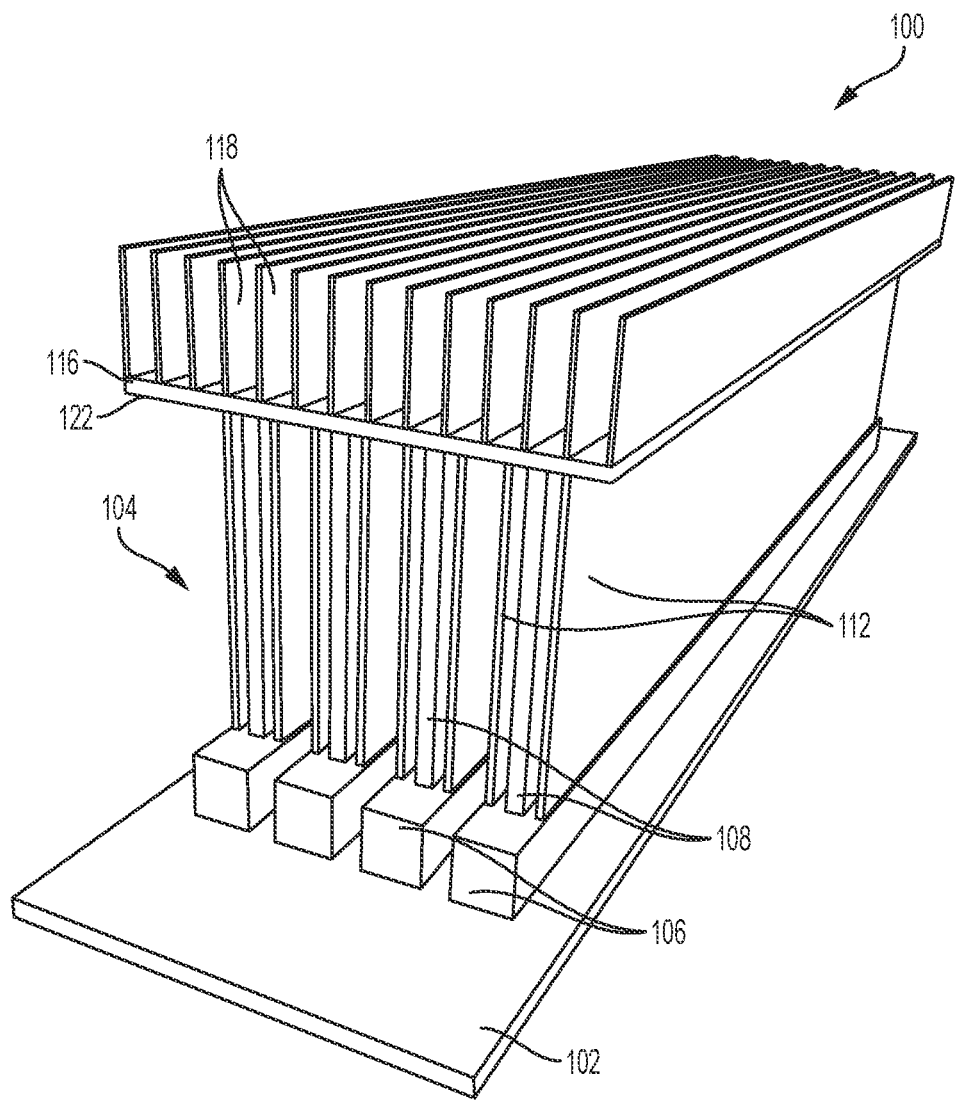
FIG. 1 is a perspective view of an assembly including heat dissipation elements in accordance with embodiments of the present disclosure.

As used herein, any relational term, such as "first," "second," "over," "under," "on," "underlying," "overlying," etc., is used for clarity and convenience in understanding the disclosure and drawings and does not connote or depend on any specific preference, orientation, or order.

As used herein, the terms "distal" and "proximal" describe positions of elements in relation to a substrate upon which the elements are positioned. For example, the term "distal" refers to a position relatively more distant from the substrate, and the term "proximal" refers to a position in closer relative proximity to the substrate.

The following description provides specific details, such as material types and processing conditions in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional semiconductor fabrication techniques employed in the industry. In addition, the description provided below may not form a complete process flow for manufacturing a device or system. The structures described below do not form a complete device or system. Only those process acts and structures necessary to understand the embodiments of the present disclosure are described in detail below. Additional acts to form complete conductive structures and semiconductor devices may be performed by conventional fabrication techniques. Further, the acts described below may be performed in multiple acts or multiple acts may be performed substantially simultaneously.

In the following detailed description, reference is made to the accompanying drawings, which form a part hereof, and in which is shown, by way of illustration, specific embodiments in which the present disclosure may be practiced. These embodiments are described in sufficient detail to enable a person of ordinary skill in the art to practice the present disclosure. However, other embodiments may be utilized, and structural, logical, and electrical changes may be made without departing from the scope of the disclosure. The illustrations presented herein are not meant to be actual views of any particular system, device, structure, or memory cell, but are merely idealized representations that are employed to describe the embodiments of the present disclosure. The drawings presented herein are not necessarily drawn to scale. Additionally, elements common between drawings may retain the same numerical designation.

As used herein, the term "substantially" in reference to a given parameter, property, or condition means and includes to a degree that one skilled in the art would understand that the given parameter, property, or condition is met with a small degree of variance, such as within acceptable manufacturing tolerances. For example, a parameter that is substantially met may be at least about 90% met, at least about 95% met, or even at least about 99% met.

FIG. 1 is a perspective view of an assembly 100 including heat dissipation elements. As shown in FIG. 1, the assembly 100 may include one or more heat-generating devices 104 or components (e.g., electronic devices or integrated circuits (IC), such as, for example, memory modules, application-specific integrated circuits (ASIC), combinations thereof, or other electronic devices). In some embodiments, the memory modules may comprise random access memory (RAM) (e.g., volatile memory), such as, for example, dynamic random-access memory (DRAM), synchronous dynamic random-access memory (SDRAM) (e.g., double data rate synchronous dynamic random access memory (DDR SDRAM), such as fifth generation of double data rate synchronous dynamic random access memory (DDRS SDRAM)).

It is noted that while assemblies described herein may make specific reference to use with a RAM device, the disclosure is not so limited and may be applied to other electronic devices, integrated circuits, and/or memory devices.

In some embodiments, the assembly may be part of a system, such as a computer or computer hardware component, a server, and/or other networking hardware component. In some embodiments, the assembly may be part of a system, such as a cellular telephone, tablet, a digital camera, a personal digital assistant (PDA), portable media (e.g., music) player, etc. The electronic device further may include at least one electronic signal processor device (often referred to as a "microprocessor"). The electronic device may, optionally, further include one or more input devices for inputting information into the electronic device by a user, such as, for example, a mouse or other pointing device, a keyboard, a touchpad, a touchscreen, a button, or a control panel and one or more output devices for outputting information (e.g., visual or audio output) to a user such as, for example, a monitor, display, printer, speaker, etc., as discussed below in greater detail.

As depicted in FIG. 1, the assembly 100 may include multiple heat-generating devices 104 coupled to a base substrate 102 (e.g., a common substrate, such as, a motherboard, main board, system board, baseboard, planar board, logic board, or another type of circuit board) via one or more connectors 106. As discussed in detail in relation to FIG. 2, each of the heat-generating devices 104 may include a substrate 108 (e.g., circuit board) having electronic devices (e.g., one or more memory devices 110) electronically and physically coupled to the substrate 108.

One or more heat dissipation structures (e.g., heat spreaders 112) may be positioned proximate the heat-generating devices 104. For example, each heat-generating device 104 may be bordered by (e.g., positioned adjacent, coupled to, abutted with) heat spreaders 112 (e.g., on two opposing lateral or major side portions of the heat-generating devices 104). In some embodiments, the heat spreaders 112 may abut (e.g., be in direct physical contact) a portion of the heat-generating device 104. In some embodiments, the heat spreaders 112 may be positioned adjacent to the heat-generating devices 104, but may not be coupled to the heat-generating devices 104 or the assembly. For example, the heat spreaders 112 (e.g., and the heat sink 116) may slide over at least a portion the heat-generating device 104 in order to assemble the assembly 100 and position the heat spreaders 112.

The heat spreaders 112 may be configured to dissipate heat energy from the heat-generating devices 104. The heat spreaders 112 may enable heat energy from one or more of the heat-generating devices 104 to transfer to (e.g., pass through, disperse to) one or more of the heat spreaders 112 to be dissipated to a location distal to the assembly 100. For example, heat energy may be passed from the heat-generating devices 104 to the heat spreaders 112 and may disperse through the heat spreaders 112 (e.g., which heat spreaders 112 may be positioned directly adjacent the heat-generating devices 104). In some embodiments, the heat spreaders 112 may be sized to substantially cover one side of the heat-generating devices 104 (e.g., may cover an entirety of one side of the heat-generating device 104). For example, the heat spreaders 112 may comprise a full DIMM heat spreader 112 (FDHS). In other embodiments, the heat spreaders 112 may be of any size, shape, or arrangement suitable to dissipate heat from the heat-generating devices 104.

The heat spreaders 112 may comprise a thermally conductive material to facilitate heat dissipation. For example, the heat spreaders 112 may comprise aluminum, gold, copper, silver, indium, tin, metal alloys, a thermally conductive composite material, or combinations thereof.

The assembly 100 includes one or more additional heat dissipation structures. For example, an additional heat dissipation structure may comprise a heat sink 116 that extends over each of the heat-generating devices 104. As depicted, the heat sink 116 may extend past (e.g., overhang) the heat-generating devices 104 on one or more sides of the heat-generating devices 104 (e.g., on four lateral sides).

Figure 2:
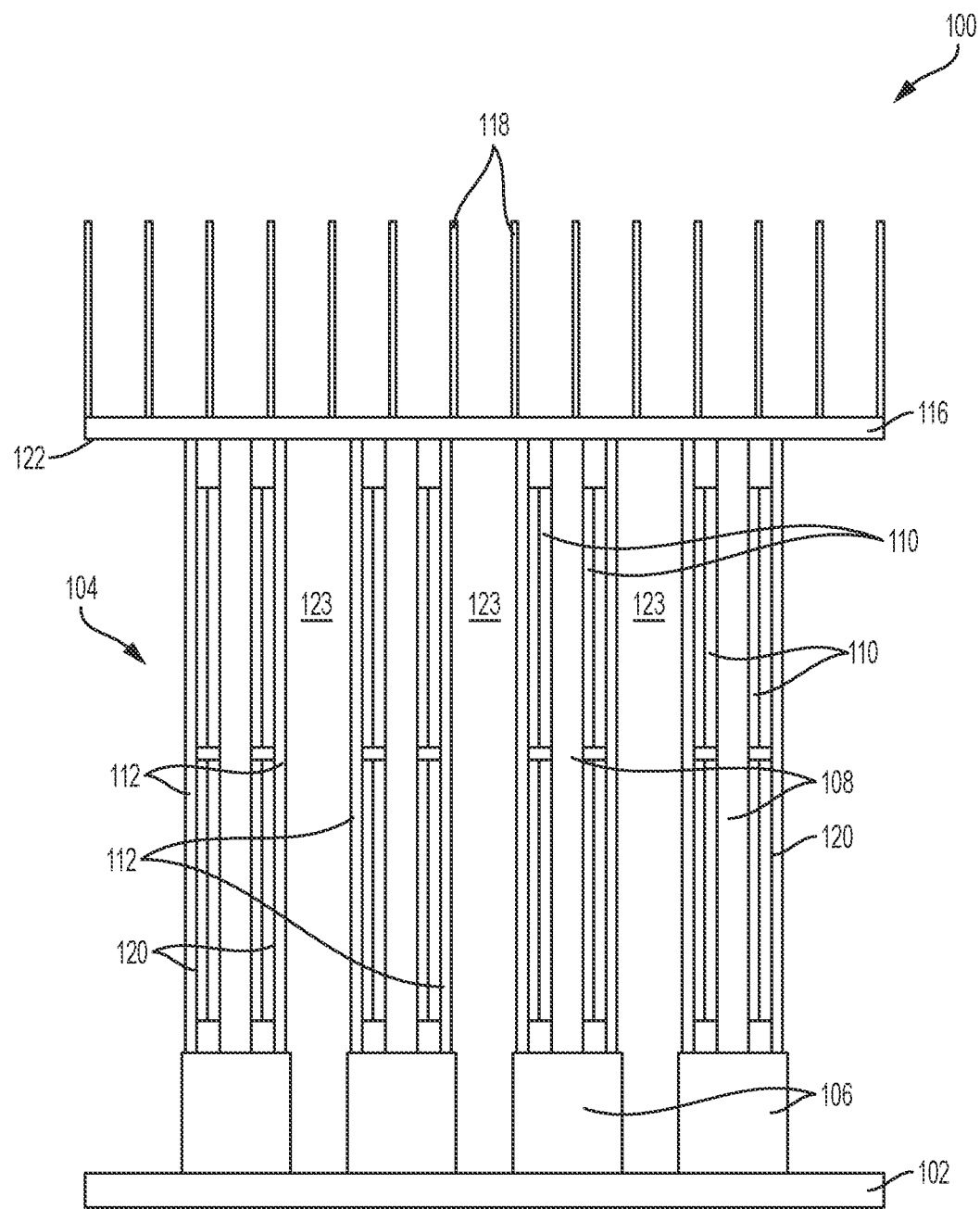
FIG. 2 is a front view of the assembly of FIG. 1.

The heat sink 116 may be configured to dissipate heat energy from the heat-generating devices 104. The heat sink 116 may enable heat energy from one or more of the heat-generating devices 104 to transfer to (e.g., pass through, disperse to) the heat sink 116 to be dissipated to a location distal to the assembly 100. For example, the heat sink 116 shown in FIG. 2 is a monolithic-style heat sink 116 having a plurality of laterally separated, vertically protruding fins 118 configured to dissipate heat, either through natural radiation and convection, or in combination with forced ventilation. The fins 118 may be of any size, shape, or arrangement suitable to dissipate heat from the heat-generating devices 104. For example, the fins 118 may comprise straight fins, pin fins, flared fins, combinations thereof, etc.

In other embodiments, the heat sink 116 may not be a monolithic-style heat sink 116, but may have any profile, configuration, or structure desirable to dissipate heat from the heat-generating devices 104, either through natural radiation and convection, or in combination with forced ventilation. For example, heat sink 116 may include channels, cavities, and/or bores extending through the heat sink 116 (e.g., may lack fins), through which cooling air or other fluid may pass or be forced.

The heat sink 116 may also comprise a thermally conductive material to facilitate heat dissipation. For example, the heat sink 116 may comprise aluminum, gold, copper, silver, indium, tin, metal alloys, a thermally conductive composite material, or any combinations thereof.

Cooling air or other fluid may pass or be forced over and/or through the heat dissipating structures (e.g., the heat spreaders 112 and/or the heat sink 116) and may assist in transferring (e.g., removing) heat energy from the heat spreader 112 and heat sink 116. For example, fluid (e.g., atmospheric air) may be passed over and/or through the heat spreader 112 and heat sink 116 passively (e.g., via the natural flow of air in an environment) and/or actively (e.g., by a fan) to assist in transferring heat energy from the heat-generating devices 104.

FIG. 2 is a front view of the assembly 100 shown in FIG. 1. As shown in FIG. 2, the heat-generating devices 104 of the assembly 100 may include the substrate 108 (e.g., circuit board) having the electronic devices (e.g., memory devices 110) coupled to the substrate 108. In some embodiments, the substrate 108 may have a plurality of memory devices 110 (e.g., four, six, eight, ten, twelve, fourteen, sixteen, eighteen, twenty, or more, or variations therebetween) connected to each major side of the substrate 108 (e.g., the sides having the greatest surface area). In some embodiments, the memory devices 110 may be aligned in multiple rows (e.g., two rows) extending along each major side of the substrate 108. The rows on one side of the substrate 108 may be aligned with, or located between, the rows on the opposing side of the substrate 108. In other embodiments, the memory devices 110 may be scattered and/or staggered along each major side of the substrate 108.

As depicted, an outer or distal portion 120 of the memory devices 110 (e.g., the portion further from the attachment point of the memory device 110 to the substrate 108) may be positioned adjacent to (e.g., abutted with, forming a common boundary with, in direct physical contact with, thermally and/or mechanically attached with) a respective heat spreader 112. Such direct contact may assist in the transfer of heat energy from the memory devices 110 to the heat spreaders 112.

One or more of the substrates 108 (e.g., each substrate 108) may extend from the base substrate 102 (e.g., from connectors 106) to a location adjacent to the heat sink 116. For example, the substrates 108 may each extend to the heat sink 116 and be in contact with (e.g., direct physical contact, abutted with, forming a common boundary with, thermally and/or mechanically attached with) a surface (e.g., a lower surface 122) of the heat sink 116 that is positioned relatively closer to the base substrate 102. In such an embodiment, the substrates 108 may be abutted with, but not physically attached to, the lower surface 122 of the heat sink 116. In some embodiments, the substrates 108 may be abutted with and coupled to the lower surface 122 of the heat sink 116 (e.g., via another material or element, such as a suitable thermal interface material (TIM), for example, a thermally conductive epoxy or other polymer or a thermally conductive tape). Such direct contact may assist in the transfer of heat energy from the substrate 108 to the heat sink 116.

In some embodiments, one or more of the heat spreaders 112 (e.g., each heat spreader 112) may extend from the base substrate 102 (e.g., from a location proximate the connectors 106) to a location adjacent to the heat sink 116. For example, the heat spreaders 112 may each extend to the heat sink 116 and be in contact with (e.g., direct physical contact, abutted with, forming a common boundary with, thermally and/or mechanically attached with) a surface (e.g., a lower surface 122) of the heat sink 116 that is positioned relatively closer to the base substrate 102. In such an embodiment, the heat spreaders 112 may be abutted with, but not physically attached to, the lower surface 122 of the heat sink 116. In some embodiments, the heat spreaders 112 may be abutted with and coupled to the lower surface 122 of the heat sink 116 (e.g., via a suitable TIM such as a thermally conductive epoxy or other polymer or a thermally conductive tape). Such direct contact may assist in the transfer of heat energy from the heat spreaders 112 to the heat sink 116. Such positioning may act to define fluid channels 123 between the substrates 108 and memory devices 110. For example, a portion of the heat sink 116 and the heat spreaders 112 (e.g., along with portions of the connectors 106 and the base substrate 102) may define channels 123 that enhance the removal of heat energy from at least the heat spreaders 112 by directing fluid (e.g., air) through the substantially enclosed channels 123.

In some embodiments, one or more of the heat spreaders 112 may comprise a substantially flat (e.g., planar) plate extending along a majority of (e.g., an entirety of) one major side of an adjacent substrate 108 and/or memory devices 110. In some embodiments, one or more of the heat spreaders 112 may comprise heat dissipation features, such as, for example, heat-dissipating fins extending transverse to a major plane of heat spreaders 112.

Figure 3:
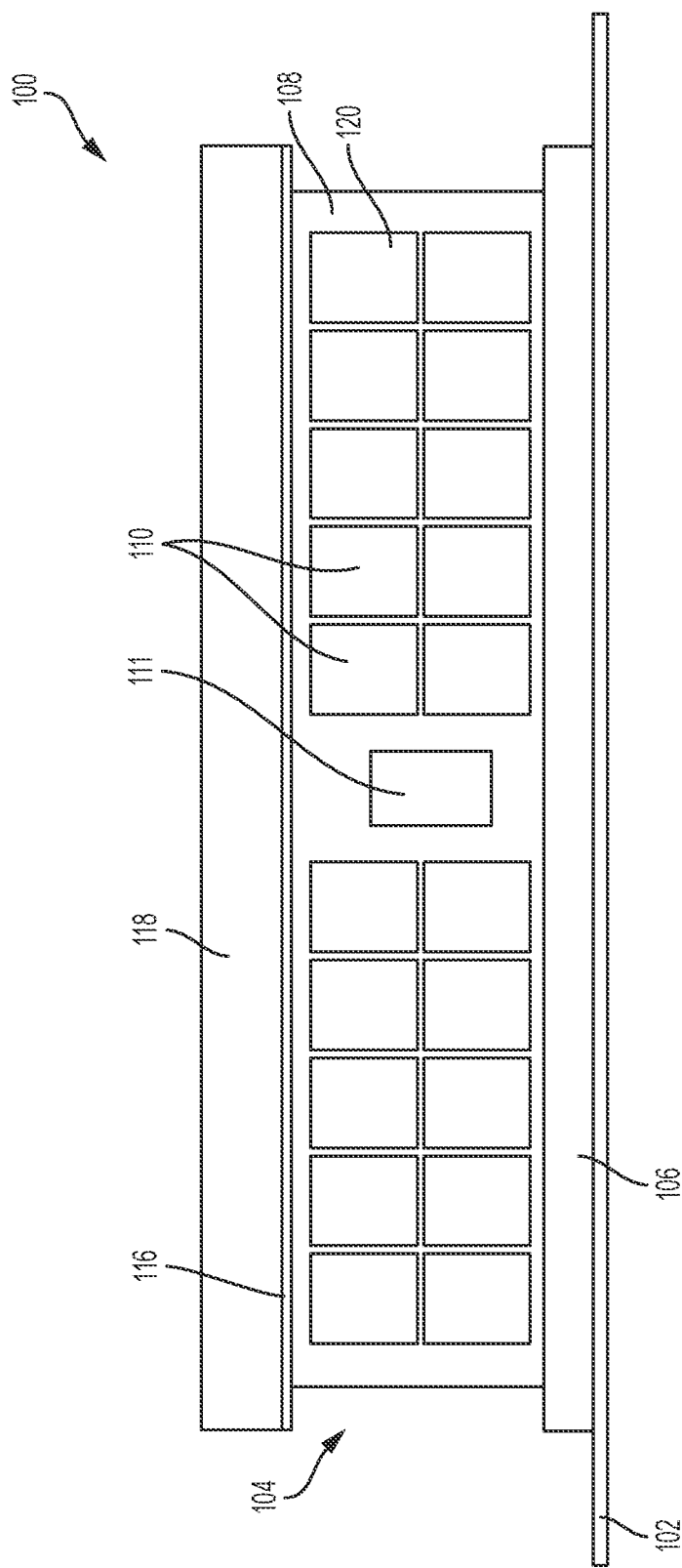
FIG. 3 is a side view of the assembly of FIG. 2 with some components removed for clarity.

FIG. 3 is a side view of the assembly of FIG. 2 with the heat spreaders 112 omitted for clarity. As shown in FIG. 3, each substrate 108 may include memory devices 110 (e.g., twenty memory devices 110 and a control/buffer unit 111 on each major side) coupled to the base substrate 102 via the connector 106. The substrate 108 may extend to and be in direct contact (e.g., mechanical and thermal contact) with the heat sink 116.

Figure 4:
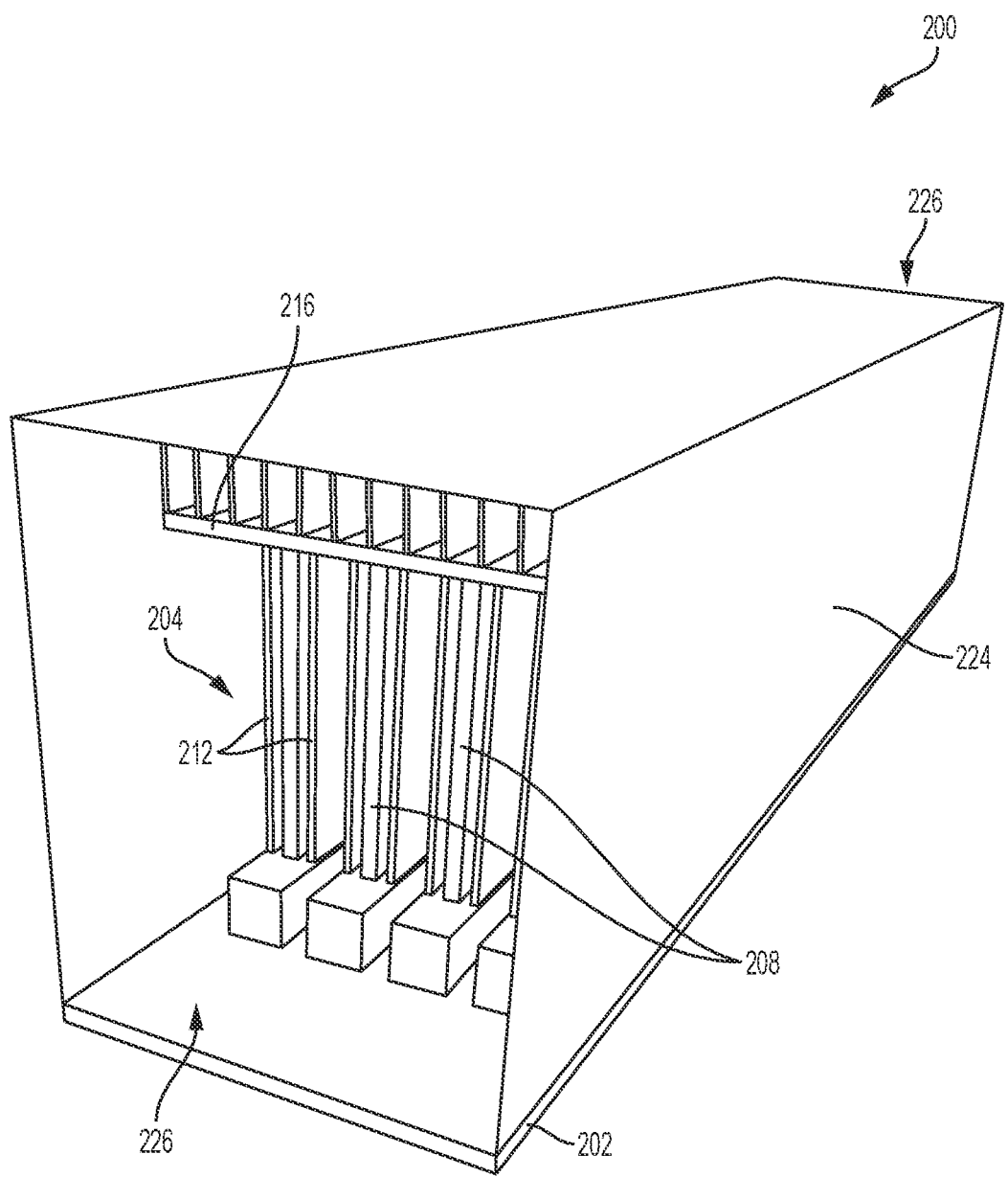
FIG. 4 is a perspective view of an assembly including heat dissipation elements in accordance with embodiments of the present disclosure.

FIG. 4 is a perspective view of an assembly 200 including heat dissipation elements. The assembly 200 may be similar to and include similar components to the assembly 100 described above in relation to FIGS. 1 through 3. As shown in FIG. 4, the assembly 200 may include one or more heat-generating devices 204 or components (e.g., memory devices 210 (FIG. 5) coupled to substrates 208) on a base substrate 202. One or more heat dissipation structures (e.g., heat spreaders 212, heat sink 216) may be positioned proximate the heat-generating devices 204.

The assembly 200 includes a fluid flow feature (e.g., chassis 224) that assists in directing fluid flow about (e.g., through) one or more components of the assembly 200. For example, the chassis 224 may extend around a portion of the assembly 200 (e.g., around a majority of the heat-generating devices 204 and may at least partially enclose the heat-generating devices 204). The chassis 224 may include one or more openings. For example, the chassis 224 may include openings 226 positioned at opposing ends of the chassis 224 to enable fluid flow through the chassis 224 by enabling fluid (e.g., air) to flow in one opening 226, to flow through the chassis 224 and around the heat-generating devices 204, and to exit through the other opening 226 at the opposing end of the chassis 224.

In some embodiments, a combination of the chassis 224 and the base substrate 202 may partially enclose (e.g., surround, extend around) the heat-generating devices 204. For example, a first side of the chassis 224 may be positioned adjacent (e.g., coupled to) the base substrate 202 on a first side of the assembly 200, the chassis 224 may extend around the heat-generating devices, and a second side of the chassis 224 may be positioned adjacent (e.g., coupled to) the base substrate 202 on a second side of the assembly 200. As depicted, the chassis 224 may extend around multiple sides of the heat-generating devices 204 (e.g., three sides) and may be coupled to the base substrate 202 in order to enclose the heat-generating devices 204 about at least one axis of the assembly 200.

Figure 5:
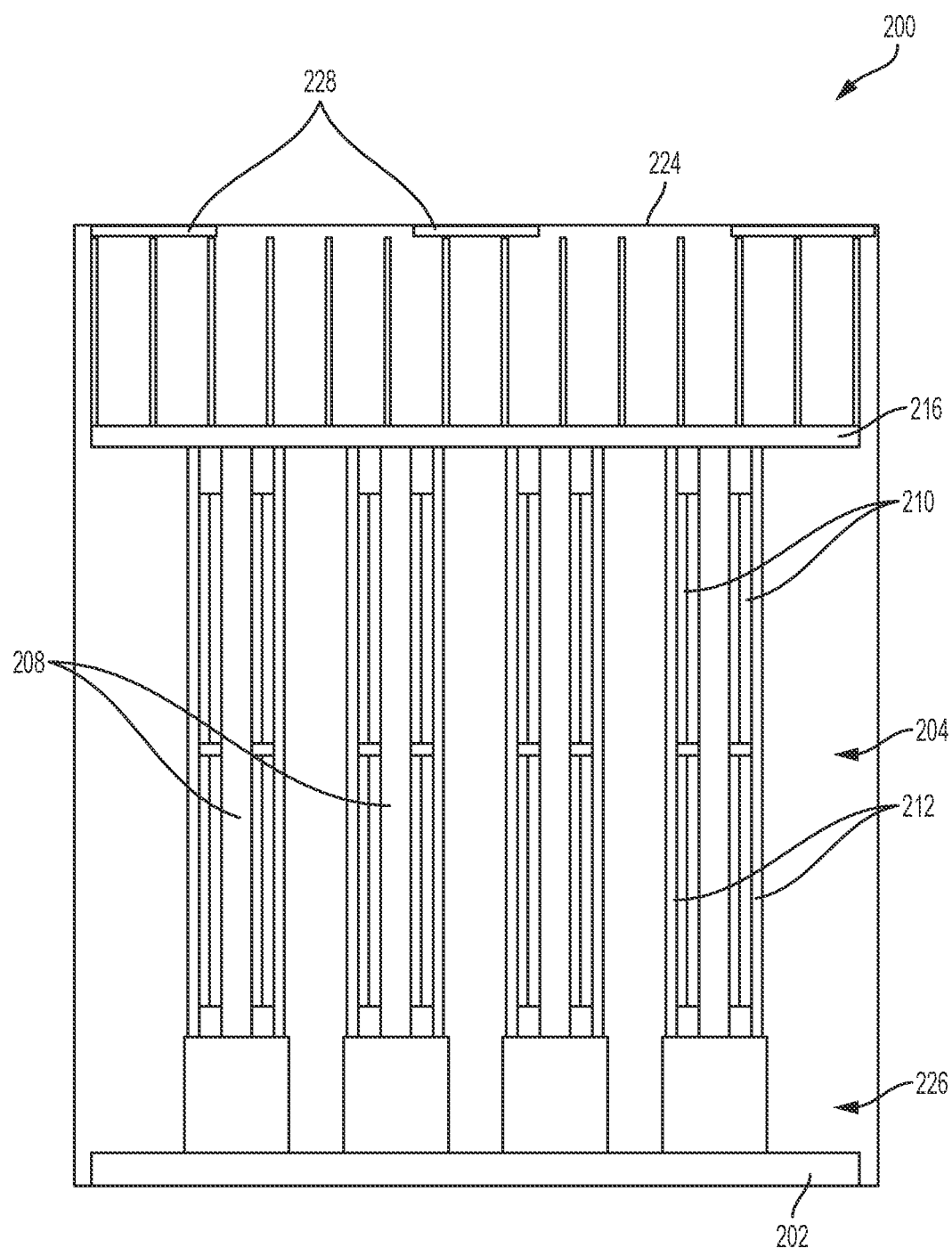
FIG. 5 is a front view of the assembly of FIG. 4.

FIG. 5 is a front view of the assembly 200 of FIG. 4. As shown in FIG. 5, the chassis 224 may define a channel through the assembly 200 and may extend around the substrates 208, the memory devices 210, the heat spreaders 212, and the heat sink 216. In some embodiments, the chassis 224 may contact (e.g., be coupled with) one or more of the components of the assembly 200 (e.g., the base substrate 202 and/or the heat sink 216). In some embodiments, clearance (e.g., spacing for fluid flow) may be provided between the chassis 224 and one or more of the components of the assembly 200 (e.g., the base substrate 202, the heat spreaders 212, and/or the heat sink 216). For example, the chassis 224 may extend about the heat sink 216 while being spaced from the heat sink 216.

In some embodiments, one or more resilient elements (e.g., springs 228) may be positioned between the chassis 224 (e.g., coupled to the chassis 224) and the heat sink 216 in order to enhance the contact between the heat sink 216 and one or more of the substrates 208 and the heat spreaders 212. For example, the springs 228 may bias the heat sink 216 against the substrates 208. The underside of heat sink 216 may be slotted to receive ends of the substrates 208, the heat spreaders 212, or both to enhance heat transfer and lend structural stability to the assembly.

Referring to FIGS. 4 and 5, in operation, cooling air or other fluid may pass or be forced over and/or through the heat dissipating structures (e.g., the heat spreaders 212, the heat sink 216, and, optionally, through the chassis 224) and may assist in transferring (e.g., removing) heat energy from the heat spreader 212 and heat sink 216, which heat energy is transferred to the heat spreader 212 and heat sink 216 from the heat-generating devices 204 (e.g., the substrates 208 and/or memory devices 210). For example, fluid (e.g., atmospheric air) may be passed over and/or through the heat spreader 212 and heat sink 216 (e.g., through the channel defined at least partially by the chassis 224) passively and/or actively to assist in transferring heat energy from the heat-generating devices 204.

In some embodiments, the fluid flow may also directly transfer heat from the heat-generating devices 204 along with the heat spreader 212 and heat sink 216.

Figure 6:
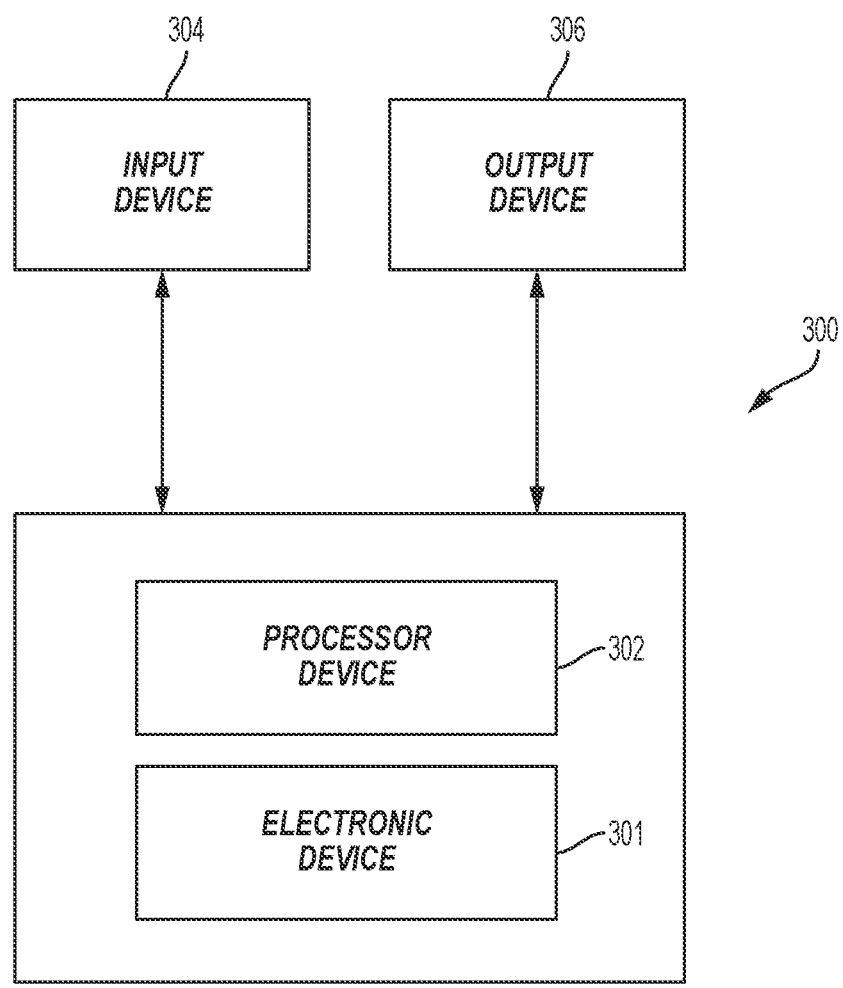
FIG. 6 is a schematic block diagram illustrating one embodiment of an electronic system that includes an assembly like the assemblies shown in FIGS. 1 through 5.

The assemblies 100, 200 as shown in FIGS. 1 through 5 may be used in embodiments of electronic systems of the present disclosure. For example, FIG. 6 is a block diagram of an illustrative electronic system 300 according to the present disclosure. The electronic system 300 may comprise, for example, a computer or computer hardware component, a server or other networking hardware component, a cellular telephone, a digital camera, a personal digital assistant (PDA), portable media (e.g., music) player, etc. The electronic system 300 includes at least one electronic device 301, such as one of the assemblies 100, 200 (e.g., a RAM memory assembly) shown and described above with reference to FIGS. 1 through 5. The electronic system 300 further may include at least one electronic signal processor device 302 (often referred to as a "microprocessor"). The electronic system 300 may, optionally, further include one or more input devices 304 for inputting information into the electronic system 300 by a user, such as, for example, a mouse or other pointing device, a keyboard, a touchpad, a button, or a control panel. The electronic system 300 may further include one or more output devices 306 for outputting information (e.g., visual or audio output) to a user such as, for example, a monitor, display, printer, speaker, etc. The one or more input devices 304 and output devices 306 may communicate electrically with at least one of the electronic device 301 and the electronic signal processor device 302.

Embodiments of the present disclosure may be particularly useful in improving thermal performance of assemblies (e.g., electronic assemblies) by enabling a majority of the components (e.g., all components) of the assembly (e.g., a memory assembly) to be cooled. The assembly requires only a relatively low cost heat sink on an upper portion of the assembly top and, optionally, a chassis to cover the assembly and guide air flow through the assembly. Such an assembly may be utilized for single memory module or multiple modules, including multiple modules have relatively tight lateral spacing between modules. Such assemblies may not require the use of local active cooling features (e.g., fans positioned directly adjacent the heat sinks) to provide adequate air flow, but may move the cooling fluid using only convection. For a system, system cooling air (e.g., flow that is provided at a system level for multiple assemblies) may be guided to flow through the assembly. Such assemblies may be relatively easy to install by placing a heat sink over the top of a memory module array and extending heat spreaders from the heat sink over one or both sides of each memory module in the array and, optionally, placing a chassis to cover the array. The chassis may be a separate component or be part of the heat sink assembly.

Accordingly, an assembly includes at least one substrate, at least one electronic device coupled to the substrate, and heat dissipation elements. The heat dissipation elements may comprise at least one heat spreader in physical communication with the at least one electronic device and at least one heat sink in thermal communication with the at least one heat spreader.

Further, an assembly may include a base substrate, circuit boards coupled to the base substrate, each circuit board having at least one heat-generating component coupled thereto, and heat dissipation elements. The heat dissipation elements include heat spreaders, each being in physical communication with the at least one heat-generating component of one of the printed circuit boards and at least another heat dissipation element in physical communication with the heat spreaders. The assembly further includes a chassis extending around at least a portion of the printed circuit boards and the heat dissipation elements.

Further still, a system may include at least one electronic signal processor, a semiconductor device configured to communicate electrically with the at least one electronic signal processor, and a memory assembly. The memory assembly includes a base substrate comprising connectors, circuit boards, each being coupled to one connector and having memory devices coupled on opposing sides of the respective circuit board, and heat dissipation elements. The heat dissipation elements include heat spreaders positioned on the opposing sides of the printed circuit boards and a heat sink in thermal communication with each of the heat spreaders and at least one of the circuit boards.

Further still a method of dissipating heat energy includes transferring heat energy from memory devices coupled to circuit boards to heat spreaders positioned adjacent to the memory devices and transferring the heat energy from the heat spreaders to a heat sink that is in thermal communication via an abutting interface with each of the circuit boards.

While the present disclosure is susceptible to various modifications and alternative forms, specific embodiments have been shown by way of example in the drawings and have been described in detail herein. However, the present disclosure is not intended to be limited to the particular forms disclosed. Rather, the present disclosure is to cover all modifications, combinations, equivalents, and alternatives falling within the scope of the present disclosure as defined by the following appended claims and their legal equivalents.

What is claimed is:

1. An assembly, comprising:
   a base substrate;
   substrates in electronic communication with the base substrate;
   one or more electronic devices coupled to at least one substrate of the substrates; and
   heat dissipation elements comprising:
      a heat spreader adjacent to the one or more electronic devices;
      a heat sink at a distal end of the substrates at a location opposite the base substrate, the heat sink in thermal communication with the heat spreader;
      a chassis including openings at opposing ends, the chassis comprising:
         a first side coupled to the base substrate on a first side of the assembly;
         a second side coupled to the base substrate on a second side of the assembly; and
         a portion adjacent the heat sink; and
      a resilient element between the chassis and the heat sink.

2. The assembly of claim 1, wherein the at least one substrate comprises a circuit board.

3. The assembly of claim 2, wherein at least one of the one or more of the electronic devices comprises a memory device coupled to the circuit board.

4. The assembly of claim 1, wherein the one or more electronic devices comprises multiple electronic devices, each of the substrates having at least one of the multiple electronic devices coupled thereto.

5. The assembly of claim 4, wherein each of the substrates physically contacts the heat sink.

6. The assembly of claim 1, wherein the heat sink overlies and laterally extends beyond each of the substrates.

7. The assembly of claim 1, wherein the portion of the chassis contacts the heat sink.

8. The assembly of claim 7, wherein the portion of the chassis is coupled with the heat sink.

9. The assembly of claim 1, wherein:
   the one or more electronic devices comprises multiple electronic devices; and
   the at least one substrate has two of the multiple electronic devices positioned on opposing sides thereof.

10. The assembly of claim 9, further comprising an additional heat spreader, the heat spreader and the additional heat spreader positioned on each of the opposing sides of the at least one substrate, each of the heat spreader and the additional heat spreader in physical communication with the two of the multiple electronic devices.

11. A system, comprising:
    an electronic signal processor; and
    a memory assembly configured to communicate electrically with the electronic signal processor,
    the memory assembly comprising:
       a base substrate comprising connectors;
       circuit boards having opposing sides, each circuit board of the circuit boards coupled to a respective connector of the connectors and having memory devices coupled to each of the opposing sides;
       heat dissipation elements comprising:
          heat spreaders positioned on each of the opposing sides of the circuit boards; and
          a heat sink in thermal communication with the heat spreaders; and
       a chassis extending around the circuit boards and the heat dissipation elements, the chassis comprising:
          openings at opposing ends thereof and configured to enable fluid flow therethrough;
          a first side coupled to the base substrate on a first side of the memory assembly;
          a second side coupled to the base substrate on a second side of the memory assembly; and
          a portion adjacent the heat sink.

12. The system of claim 11, wherein the chassis extends around three sides of the memory assembly.

13. The system of claim 11, further comprising a resilient element between the chassis and the heat sink.

14. The system of claim 11, wherein each of the heat spreaders is in physical contact with at least one of the memory devices.

15. The system of claim 11, wherein each circuit board of the circuit boards has more than one memory device on each side thereof.

16. A method of dissipating heat energy from an assembly, the method comprising:
    transferring heat energy from memory devices coupled to circuit boards to heat spreaders positioned adjacent to the memory devices, the circuit boards being electronically coupled to a base substrate at a first location;
    transferring heat energy from the heat spreaders to a heat sink positioned at a second location of the circuit boards away from the first location, the heat sink being in thermal communication with the memory devices of the circuit boards; and
    transferring heat energy to a fluid flow by directing the fluid flow through openings at opposing ends of a chassis and through a channel defined by the chassis, a first side of the chassis coupled to the base substrate on a first side of the assembly and a second side of the chassis coupled to the base substrate on a second side of the assembly.

17. The method of claim 16, further comprising transferring heat energy from the circuit boards to the heat sink via an abutting interface between the heat sink and each of the circuit boards.

18. The method of claim 16, further comprising providing the chassis around the memory devices.

19. The method of claim 16, further comprising directing the fluid flow through an additional channel partially defined by the memory devices and a surface of the heat sink.

* * * * *

UNITED STATES PATENT AND TRADEMARK OFFICE
CERTIFICATE OF CORRECTION

PATENT NO. : 11,617,284 B2
APPLICATION NO. : 17/201085
DATED : March 28, 2023
INVENTOR(S) : Xiaopeng Qu It is certified that error appears in the above-identified patent and that said Letters Patent is hereby corrected as shown below:

In the Specification

Column 3, Line 42, change "(DDRS" to --(DDR5--

Signed and Sealed this
Thirtieth Day of January, 2024

Katherine Kelly Vidal
*Director of the United States Patent and Trademark Office*